United States Patent
Negley et al.

(10) Patent No.: US 9,657,922 B2
(45) Date of Patent: May 23, 2017

(54) ELECTRICALLY INSULATIVE COATINGS FOR LED LAMP AND ELEMENTS

(71) Applicant: CREE, INC., Durham, NC (US)

(72) Inventors: Gerald Negley, Chapel Hill, NC (US); Praneet Athalye, Morrisville, NC (US); Shaow B. Lin, Morrisville, NC (US)

(73) Assignee: Cree, Inc., Durham, NC (US)

(*) Notice: Subject to any disclaimer, the term of this patent is extended or adjusted under 35 U.S.C. 154(b) by 90 days.

(21) Appl. No.: 13/838,198

(22) Filed: Mar. 15, 2013

(65) Prior Publication Data

US 2014/0268819 A1 Sep. 18, 2014

(51) Int. Cl.
| | |
|---|---|
| *H01J 19/38* | (2006.01) |
| *F21V 15/00* | (2015.01) |
| *F21K 9/90* | (2016.01) |
| *F21V 25/02* | (2006.01) |
| *F21K 9/232* | (2016.01) |
| *F21K 9/60* | (2016.01) |
| *C09D 183/04* | (2006.01) |
| *C08L 33/08* | (2006.01) |
| *C08L 75/04* | (2006.01) |
| *C08L 75/16* | (2006.01) |
| *H05K 3/28* | (2006.01) |
| *F21Y 115/10* | (2016.01) |
| *F21Y 107/30* | (2016.01) |

(52) U.S. Cl.
CPC ............ *F21V 15/00* (2013.01); *F21K 9/232* (2016.08); *F21K 9/60* (2016.08); *F21K 9/90* (2013.01); *F21V 25/02* (2013.01); *C08L 33/08* (2013.01); *C08L 75/04* (2013.01); *C08L 75/16* (2013.01); *C09D 183/04* (2013.01); *F21Y 2107/30* (2016.08); *F21Y 2115/10* (2016.08); *H01L 2924/0002* (2013.01); *H05K 3/287* (2013.01); *H05K 2201/10106* (2013.01); *Y10T 29/49117* (2015.01); *Y10T 29/49146* (2015.01)

(58) Field of Classification Search
CPC ......................................................... F21K 9/50
USPC ............................................................ 445/58
See application file for complete search history.

(56) References Cited

U.S. PATENT DOCUMENTS 2,712,533 A * 7/1955 Mitchell ........................ 524/270
3,581,162 A   5/1971 Wheatley
(Continued)

FOREIGN PATENT DOCUMENTS

DE   102007045540 A1   4/2009
EP       1058221 A2   12/2000
(Continued)

OTHER PUBLICATIONS

European Patent Office, International Application No. PCT/US2014/024472 International Search Report and Written Opinion dated Jul. 3, 2014, 14 pages.

(Continued)

*Primary Examiner* — Nimeshkumar Patel
*Assistant Examiner* — Jacob R Stern
(74) *Attorney, Agent, or Firm* — Christopher J. Knors; Moore & Van Allen PLLC

(57) ABSTRACT

The present disclosure discloses a method for providing protective coatings onto an energizable LED component coupled to an electrical path. More particularly, the present disclosure relates to LED lamps comprising transparent dielectric coatings and LED lamps and devices made thereby.

28 Claims, 5 Drawing Sheets

(56) References Cited

U.S. PATENT DOCUMENTS

| | | | |
|---|---|---|---|
| 3,621,323 A | 11/1971 | Thomas et al. |
| 4,603,168 A | 7/1986 | Sasaki et al. |
| 5,036,244 A | 7/1991 | Shaffer |
| 5,124,618 A | 6/1992 | Ohtaka et al. |
| 5,463,280 A | 10/1995 | Johnson |
| 5,561,346 A | 10/1996 | Byrne |
| 5,585,783 A | 12/1996 | Hall |
| 5,655,830 A | 8/1997 | Ruskouski |
| 5,688,042 A | 11/1997 | Madadi et al. |
| 5,723,937 A | 3/1998 | Whitman et al. |
| 5,806,965 A | 9/1998 | Deese |
| 5,947,588 A | 9/1999 | Huang |
| 5,949,347 A | 9/1999 | Wu |
| 6,220,722 B1 | 4/2001 | Begemann |
| 6,227,679 B1 | 5/2001 | Zhang et al. |
| 6,234,648 B1 | 5/2001 | Borner et al. |
| 6,250,774 B1 | 6/2001 | Begemann et al. |
| 6,276,822 B1 | 8/2001 | Bedrosian et al. |
| 6,465,961 B1 | 10/2002 | Cao |
| 6,501,219 B1 | 12/2002 | Bigio et al. |
| 6,523,978 B1 | 2/2003 | Huang |
| 6,538,364 B1 | 3/2003 | Shaw |
| 6,550,953 B1 | 4/2003 | Ichikawa et al. |
| 6,634,770 B2 | 10/2003 | Cao |
| 6,659,632 B2 | 12/2003 | Chen |
| 6,709,132 B2 | 3/2004 | Ishibashi |
| 6,803,607 B1 | 10/2004 | Chan et al. |
| 6,848,819 B1 | 2/2005 | Arndt et al. |
| 6,864,513 B2 | 3/2005 | Lin et al. |
| 6,940,101 B2 | 9/2005 | Yano et al. |
| 6,948,829 B2 | 9/2005 | Verdes et al. |
| 6,982,518 B2 | 1/2006 | Chou et al. |
| 7,048,412 B2 | 5/2006 | Martin et al. |
| 7,080,924 B2 | 7/2006 | Tseng et al. |
| 7,086,756 B2 | 8/2006 | Maxik |
| 7,086,767 B2 | 8/2006 | Sidwell et al. |
| 7,144,135 B2 | 12/2006 | Martin et al. |
| 7,165,866 B2 | 1/2007 | Li |
| 7,172,314 B2 | 2/2007 | Currie et al. |
| 7,354,174 B1 | 4/2008 | Yan |
| 7,396,142 B2 | 7/2008 | Laizure, Jr. et al. |
| 7,600,882 B1 | 10/2009 | Morejon et al. |
| 7,726,836 B2 | 6/2010 | Chen |
| 7,824,065 B2 | 11/2010 | Maxik |
| 7,965,023 B1 | 6/2011 | Liang |
| 8,021,025 B2 | 9/2011 | Lee |
| 8,253,316 B2 | 8/2012 | Sun et al. |
| 8,272,762 B2 | 9/2012 | Maxik et al. |
| 8,274,241 B2 | 9/2012 | Guest et al. |
| 8,277,082 B2 | 10/2012 | Dassanayake et al. |
| 8,282,249 B2 | 10/2012 | Liang et al. |
| 8,282,250 B1 | 10/2012 | Dassanayake et al. |
| 8,292,468 B2 | 10/2012 | Narendran et al. |
| 8,322,896 B2 | 12/2012 | Falicoff et al. |
| 8,371,722 B2 | 2/2013 | Carroll |
| 8,400,051 B2 | 3/2013 | Hakata et al. |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,427,037 B2 | 4/2013 | Liang et al. |
| 8,434,883 B2 | 5/2013 | Doan et al. |
| 8,449,154 B2 | 5/2013 | Uemoto et al. |
| 8,502,468 B2 | 8/2013 | Li et al. |
| 8,556,465 B2 | 10/2013 | Lee et al. |
| 8,641,237 B2 | 2/2014 | Chuang |
| 8,653,723 B2 | 2/2014 | Cao et al. |
| 8,696,168 B2 | 4/2014 | Li et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 2004/0201990 A1 | 10/2004 | Meyer |
| 2006/0152140 A1* | 7/2006 | Brandes ............... C09K 11/586 313/503 |
| 2009/0184618 A1 | 7/2009 | Hakata et al. |
| 2010/0201284 A1 | 8/2010 | Kraus |
| 2010/0314996 A1 | 12/2010 | van de Ven et al. |
| 2011/0044026 A1 | 2/2011 | Deeben et al. |
| 2011/0216523 A1 | 9/2011 | Tong et al. |
| 2012/0040585 A1 | 2/2012 | Huang |
| 2012/0056542 A1 | 3/2012 | Hu |
| 2012/0224352 A1* | 9/2012 | Yagi et al. ............... 362/84 |
| 2012/0224363 A1* | 9/2012 | Van De Ven ............ 362/231 |
| 2012/0236573 A1 | 9/2012 | Yamamoto et al. |
| 2012/0250304 A1 | 10/2012 | Harbers et al. |
| 2012/0250320 A1 | 10/2012 | Harbers et al. |
| 2013/0107517 A1 | 5/2013 | Shih et al. |
| 2013/0170175 A1 | 7/2013 | Negley et al. |
| 2013/0187537 A1 | 7/2013 | Hikmet et al. |
| 2013/0271972 A1 | 10/2013 | Hussell et al. |
| 2013/0271981 A1 | 10/2013 | Hussell et al. |
| 2013/0271987 A1 | 10/2013 | Hussell et al. |
| 2014/0016312 A1 | 1/2014 | Moon |
| 2014/0168977 A1 | 6/2014 | Hu |
| 2014/0191648 A1 | 7/2014 | Lin |
| 2014/0268819 A1 | 9/2014 | Negley et al. |

FOREIGN PATENT DOCUMENTS

| | | |
|---|---|---|
| EP | 0890059 B1 | 6/2004 |
| EP | 2270100 A1 | 1/2011 |
| GB | 2345954 A | 7/2000 |
| JP | H09265807 A | 10/1997 |
| JP | 2000173304 A | 6/2000 |
| JP | 2001118403 A | 4/2001 |
| JP | 2007277456 A | 10/2007 |
| JP | 2011119187 A | 6/2011 |
| WO | 0124583 A1 | 4/2001 |
| WO | 0160119 A2 | 8/2001 |
| WO | 2009136351 A1 | 11/2009 |
| WO | 2012011279 A1 | 1/2012 |
| WO | 2012031533 A1 | 3/2012 |
| WO | 2012042434 A1 | 4/2012 |

OTHER PUBLICATIONS

OPTI-TEC, "Optically Clear Polyurethane Encapsulant Potting Compound," Dec. 12, 2009, downloaded from <https://web.archive.org/web/20091212O1/http://www.intertronics.co.uk/products/opt4200.htm> on Jun. 18, 2014, 3 pages.

Lamonica, Martin, "Cree Introduces an LED Bulb Edison Would Love," Mar. 5, 2013, MIT Review, downloaded from <http://www.technologyreview.com/view/512126/cree-introduces-an-led-bulb-edison-would-love/> on Jun. 18, 2014, 2 pages.

U.S. Appl. No. 13/774,078, filed Feb. 22, 2013.

U.S. Appl. No. 13/467,670, filed May 9, 2012.

U.S. Appl. No. 13/446,759, filed Apr. 13, 2012.

The International Bureau of WIPO; International Preliminary Report on Patentability for International Application No. PCT/US2014/024472 dated Sep. 24, 2015, 10 pages.

Butts, Matthew, et al.; "Silicones," Encyclopedia of Polymer Science and Technology, 2003, pp. 765-841, vol. 11.

Waddell, Walter H., "Silica, Amorphous," Kirk-Othmer Encyclopedia of Chemical Technology, 2006, pp. 1-33, vol. 22.

International Bureau of WIPO; International Preliminary Report on Patentability for International Application No. PCT/US2014/010792 dated Jul. 23, 2015, 7 pages.

International Bureau of WIPO; International Preliminary Report on Patentability for International Application No. PCT/US2014/010868 dated Jul. 23, 2015, 7 pages.

European Patent Office; International Search Report and Written Opinion for International Application No. PCT/US2014/010792 dated Mar. 31, 2014, 9 pages.

European Patent Office, International Search Report and Written Opinion for International Application No. PCT/US2014/010868 dated Apr. 11, 2014, 8 pages.

USPTO; Non-Final Office Action for U.S. Appl. No. 13/951,206 dated Dec. 3, 2014, 17 pages.

(56) References Cited

OTHER PUBLICATIONS

USPTO; Office Action for U.S. Appl. No. 13/738,575 dated Jun. 15, 2016, 20 Pages.
Cree, Inc., International Application No. PCT/US2014/010792, International Search Report and Written Opinion, Mar. 20, 2014.
Cree, Inc., International Application No. PCT/US2014/010868, International Search Report and Written Opinion, Apr. 3, 2014.
Cree, Inc., International Application No. PCT/US2014/010868, International Preliminary Report of Patentability, Jul. 23, 2015, 7 pages.
Cree, Inc., International Application No. PCT/US2014/010792, International Preliminary Report of Patentability, Jul. 23, 2015, 7 pages.
U.S. Appl. No. 13/951,206, Non-Final Office Action dated Dec. 3, 2014, 16 pages.
U.S. Appl. No. 13/738,575, Non-Final Office Action dated Jan. 5, 2015, 10 pages.
U.S. Appl. No. 13/738,575, Final Office Action dated May 6, 2015, 11 pages.
U.S. Appl. No. 13/738,575, Non-Final Office Action dated Aug. 18, 2015, 11 pages.
U.S. Appl. No. 13/738,575, Final Office Action dated Feb. 10, 2016, 9 pages.
USPTO; Office Action for U.S. Appl. No. 13/951,206 dated Nov. 1, 2016, 23 Pages.

* cited by examiner

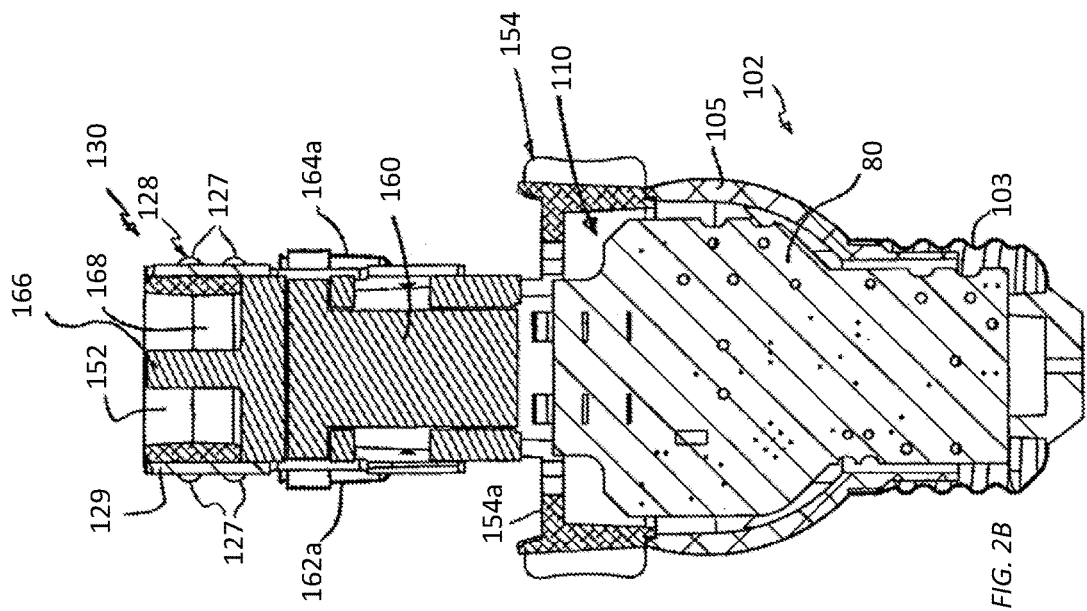
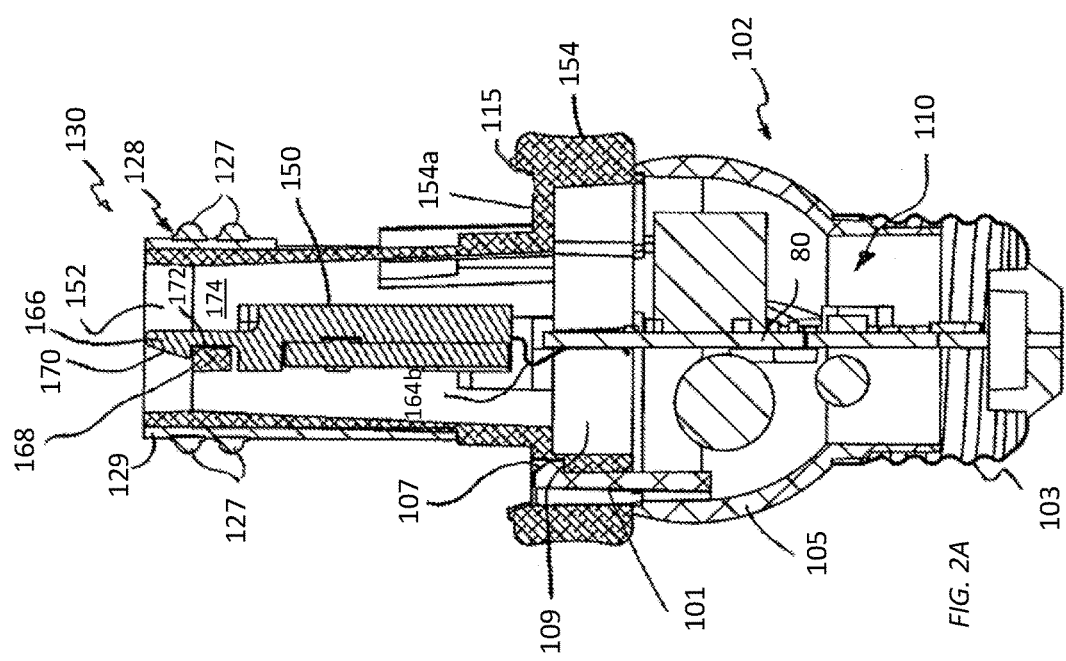

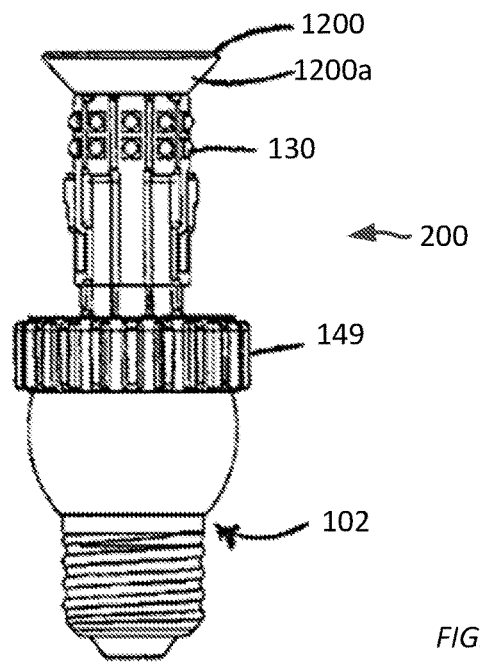
FIG. 3A
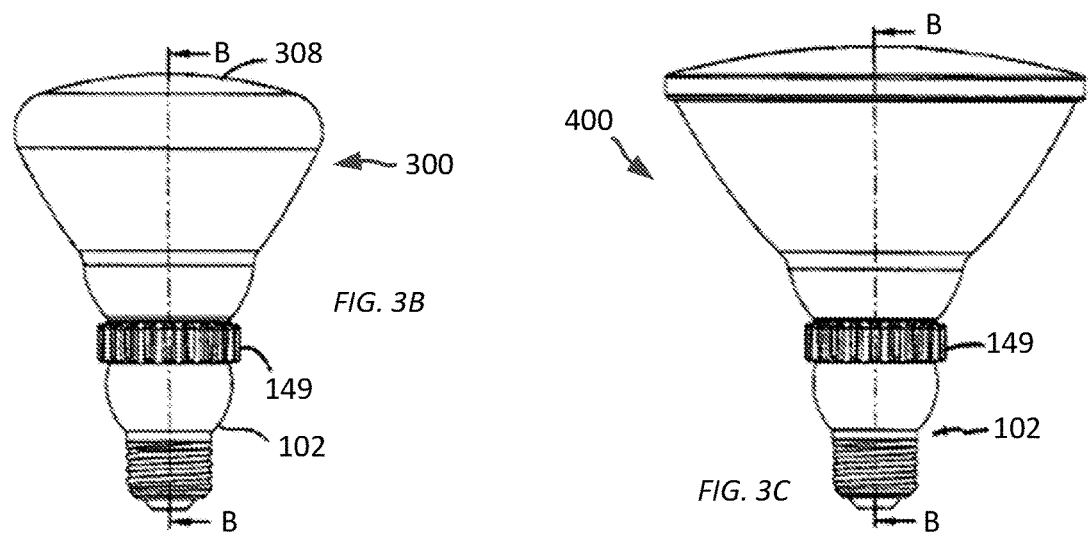
FIG. 3B
FIG. 3C

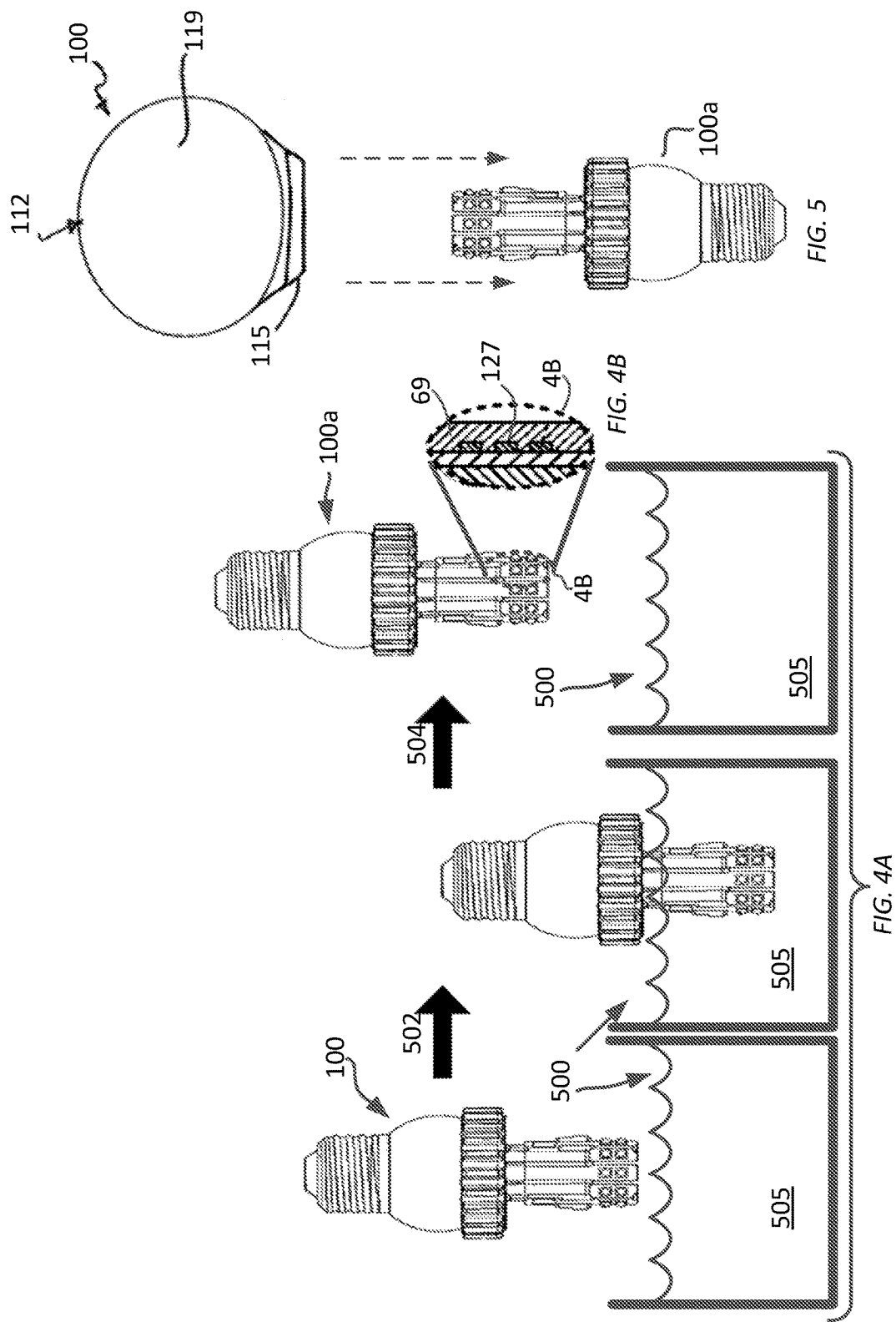

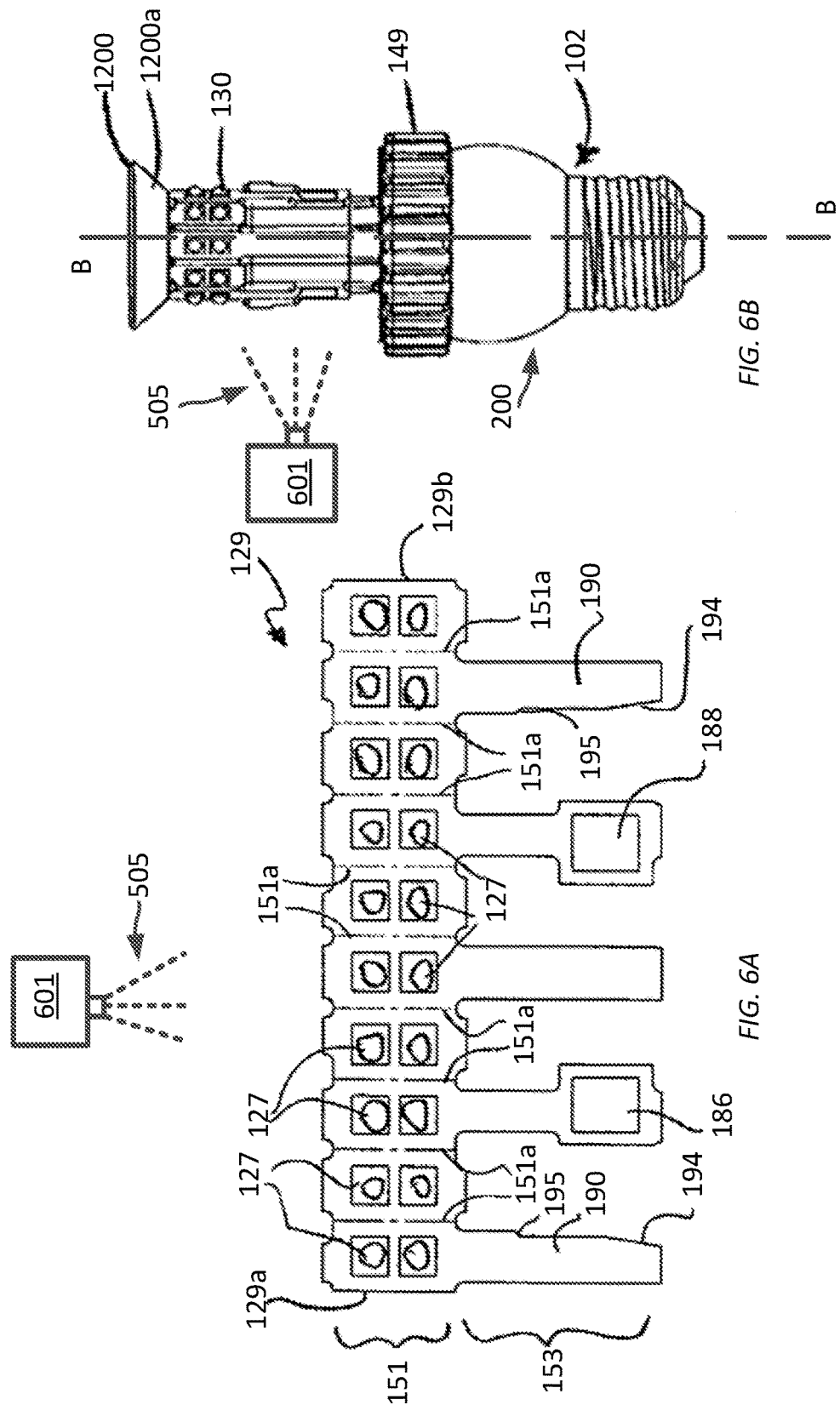

… (1) …

ELECTRICALLY INSULATIVE COATINGS FOR LED LAMP AND ELEMENTS

TECHNICAL FIELD

The present disclosure relates to light emitting diode (LED) lamps and methods of depositing coatings onto the surface of electrically conductive components within a frangible enclosure of an LED lamp. More particularly, the present disclosure relates to LED lamps comprising optically clear transparent coatings and LED lamps made thereby.

BACKGROUND

Incandescent bulbs (and fluorescent bulbs) are typically formed with a frangible enclosure (e.g. glass) that maintains a vacuum or environment to prevent oxidation of the glow filament (e.g. tungsten) or maintain function during operation. The incandescent bulb can be coated by dipping it into a silicone dispersion consisting of excess solvent (e.g., xylene) and curable silicone rubber with the subsequent removal of the solvent. Other methods include initially coating the incandescent bulb with an organic solvent-based silicone composition followed by solvent removal and/or treating the coated lamp bulb surface with a solvent-based silicone overcoat. Commercial incandescent light bulbs with a protective coating can be made using a paste-like silicone rubber compound that requires large amount of solvent to dilute the silicone rubber compound down to a high solvent containing solution to allow light bulb coating. Unfortunately, hazardous and flammable solvents such as toluene, xylene are the required solvents.

While various silicone transparent dielectric compositions are otherwise known for treating the bulbs of incandescent lights to enhance their shatter resistance, issues specific only to LED lamps remain regarding reducing or completely preventing access to the components within a frangible enclosure, the use of phosphors, the use of internal atmospheres or environments within the enclosure, as well as significant environmental concerns with solvent-based coatings. Presently, for certain types of LED lamps, protection against fire and shock hazard is required by safety agencies (e.g., Underwriters Laboratories). Protection against fire and shock is typically provided by a glass globe which covers the exposed LEDs, LED PCB, and electric connector. Because the glass is the enclosure for the product, stringent requirements are placed on the adhesive used to hold the globe onto the heat sink. Protection against the shock hazard in case the glass breaks can be augmented by a silicone coating over the glass or the use of a plastic enclosure, both of which are less than desirable. The silicone coating keeps the glass intact when it breaks and restricts access to the LED board inside. The coating process is costly, time consuming and generates waste, typically involving dipping of the glass globe in silicone, allowing for drip time and cure time in an oven at a high temperature. The process affects cosmetic appearance and gives the glass globe an elastomeric or rubbery texture and aesthetics.

SUMMARY

In a first embodiment, a method of maintaining the mechanical and electrical integrity of a light emitting diode (LED) lamp is provided. The method comprising: providing an LED lamp with energizable electrical components contained within an optically transmissive enclosure; applying a visible light transparent dielectric on at least a portion of the exposed energizable components; and maintaining the mechanical and electrical integrity of the LED lamp upon breach of the frangible enclosure.

In a first aspect, the visible light transparent dielectric can comprise one or more curable oligomeric or polymeric siloxanes, acrylates, or urethanes. In another aspect, alone or in combination with any of the previous aspects, the method can further comprise curing the one or more curable oligomeric or polymeric siloxanes, acrylates, or urethanes.

In another aspect, alone or in combination with any of the previous aspects, the visible light transparent dielectric can be a coating directly deposited on the energizable electrical components. In another aspect, alone or in combination with any of the previous aspects, the LED lamp can further comprise one or more of a reflector, a diffuser, or a lens, and wherein the visible light transparent dielectric is a deposited on the reflector, the diffuser, or the lens.

In another aspect, alone or in combination with any of the previous aspects, the method can further provide a heat sink thermally coupled to the LED assembly for transmitting heat from the LED assembly to the ambient environment, wherein the visible light transparent dielectric does not substantially alter heat transfer between the LED assembly and the heat sink.

In another aspect, alone or in combination with any of the previous aspects, the visible light transparent dielectric dampens external vibrational energy, external shear energy, or external impact energy introduced to the LED lamp. In another aspect, alone or in combination with any of the previous aspects, the visible light transparent dielectric prevents or reduces water egress into the LED assembly or the electrical path. In another aspect, alone or in combination with any of the previous aspects, the visible light transparent dielectric prevents short circuit events or ground-fault interrupt events after breach of the optically transmissive enclosure.

In another aspect, alone or in combination with any of the previous aspects, the optically transmissive enclosure is glass or ceramic. In another aspect, alone or in combination with any of the previous aspects, the visible light transparent dielectric extends from the energizable electrical components in the form of an Edison-bulb-like enclosure.

In a second embodiment, an LED assembly is provided. The LED assembly comprising: an electrical path coupled to energizable electrical components; a visible light transparent dielectric on at least a portion of the electrical path or on a least a portion of the energizable electrical components.

In one aspect, the visible light transparent dielectric comprises one or more polysiloxanes, polyacrylates, or polyurethanes. In another aspect, alone or in combination with any of the previous aspects, the visible light transparent dielectric is transparent to light between about 250 nm to about 850 nm. In another aspect, alone or in combination with any of the previous aspects, the visible light transparent dielectric is at least partially non-transparent to light between about 250 nm to about 850 nm.

In another aspect, alone or in combination with any of the previous aspects, the LED assembly can further comprise a heat sink thermally coupled to the LED assembly for transmitting heat from the LED assembly to the ambient environment. In another aspect, alone or in combination with any of the previous aspects, the LED assembly can further comprise a base coupled to heat sink. In another aspect, alone or in combination with any of the previous aspects, the LED assembly can further comprise an electrical interconnect for mechanically connecting a conductor to the heat sink, wherein the conductor is in the electrical path between the LED assembly and the base.

In another aspect, alone or in combination with any of the previous aspects, the LED assembly can further comprise an optically transmissive enclosure. In another aspect, alone or in combination with any of the previous aspects, the LED assembly can further comprise one or more of a reflector, a diffuser, or a lens, and wherein the visible light transparent dielectric is deposited on the reflector, the diffuser, or the lens. In another aspect, alone or in combination with any of the previous aspects, the visible light transparent dielectric extends from the LED array in the form of an Edison-bulb-like enclosure.

In a third embodiment, a method of coating an LED lamp is provided. The method comprising: providing an LED lamp, the LED lamp comprising: a base; an LED assembly coupled to the base, the LED assembly operable to emit light when energized through an electrical path; and contacting at least a portion of the LED assembly and at least a portion of the electrical path thereof with a visible light transparent dielectric.

In one aspect, the visible light transparent dielectric comprises one or more curable oligomeric or polymeric siloxanes, acrylates, or urethanes. In another aspect, alone or in combination with any of the previous aspects, the method can further comprise curing the one or more curable oligomeric or polymeric siloxanes, acrylates, or urethanes, the cured oligomeric or polymeric siloxanes, acrylates, or urethanes being optically transparent between about 250 nm to about 850 nm.

In another aspect, alone or in combination with any of the previous aspects, the one or more curable oligomeric or polymeric siloxanes is substantially organic solvent-free. In another aspect, alone or in combination with any of the previous aspects, the visible light transparent dielectric comprises one or more curable oligomeric or polymeric siloxanes having alkenyl-containing functional groups and/or silicon hydride functional groups.

In another aspect, alone or in combination with any of the previous aspects, the LED lamp can further comprise a submount on which the LED assembly is coupled, wherein the submount comprises at least one of a PCB, metal core board, lead frame and metal core printed circuit board, the visible light transparent dielectric sealing the subassembly to the base. In another aspect, alone or in combination with any of the previous aspects, the method can further comprise attaching an optically transmissive enclosure, the visible light transparent dielectric sealing the optically transmissive enclosure to the base. In another aspect, alone or in combination with any of the previous aspects, the LED lamp can further comprise a heat sink thermally coupled to the LED assembly for transmitting heat from the LED assembly to the ambient environment, the visible light transparent dielectric does not substantially alter heat transfer between the LED assembly and the heat sink.

In another aspect, alone or in combination with any of the previous aspects, the LED lamp can further comprise one or more of a reflector, a diffuser, or a lens, and wherein the visible light transparent dielectric is a deposited on the reflector, the diffuser, or the lens. In another aspect, alone or in combination with any of the previous aspects, the contacting with the visible light transparent dielectric provides for an Edison-bulb-like enclosure form. In another aspect, alone or in combination with any of the previous aspects, the contacting is one or more of dipping, spraying, or brushing.

BRIEF DESCRIPTION OF THE DRAWINGS

FIG. 2A is a section view taken along line A-A of FIG. 1.

FIG. 2B is a section view taken along line A-A of FIG. 1, rotated 90 degrees.

FIGS. 3A, 3B, and 3C show a prospective view of and LED assembly with a reflector and heat sink, and prospective views of exemplary PAR-like and BR-like LED lamps, respectively, usable in embodiments of the present disclosure.

FIG. 4A is an exemplary coating process in accordance with embodiments of the present disclosure.

FIG. 4B is an expanded view of the embodiment depicted in FIG. 4A.

FIG. 5 is an exemplary enclosure assembly of the embodiment of FIG. 4 in accordance with the present disclosure.

FIG. 6A is an exemplary coating process of an LED array in accordance with embodiments of the present disclosure.

FIG. 6B is an exemplary coating process of a partially assembled LED lamp in accordance with embodiments of the present disclosure.

DETAILED DESCRIPTION

Figures 1A, 1B:
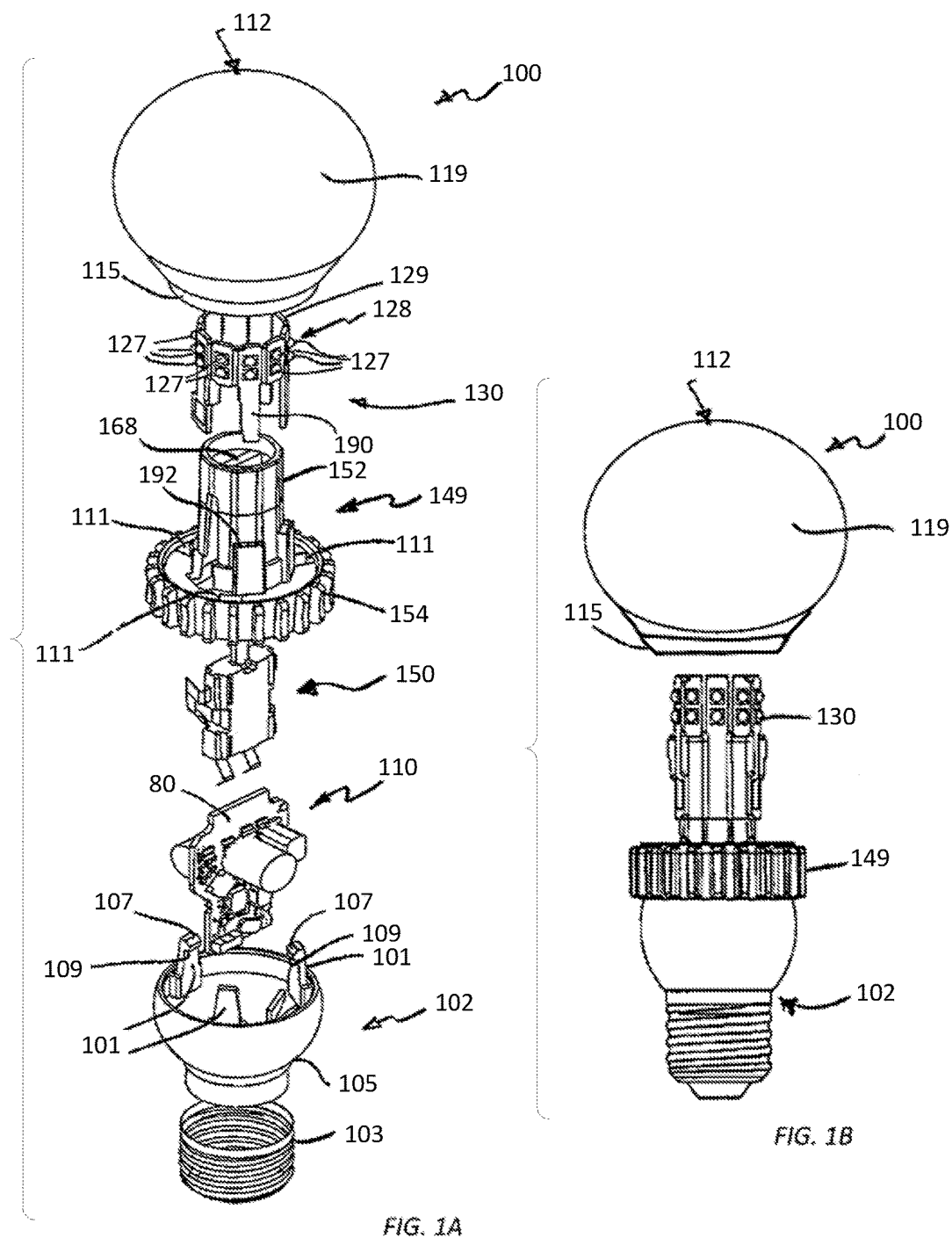
FIG. 1A is an exploded perspective view of an exemplary LED lamp usable in embodiments of the present disclosure.
FIG. 1B is a partial exploded view of a section of the LED lamp of FIG. 1A with an enclosure in accordance with embodiments of the present disclosure.

As discussed above, conventional elastomeric silicone coating of a frangible, e.g., glass enclosure for an LED lighting device is costly, as the elastomeric silicone is expensive, has limited self-life, and further involves waste removal costs. It would be desirable to simplify this process and use less silicone material, reduce costs and provide mechanical and electrical protection that meets or exceeds industry standards and voluntary standards.

Whereas a coating for a frangible enclosure for a lighting device is contemplated, the present disclosure is directed specifically to providing a transparent dielectric coating on one or more of the LED electrical interface components, e.g., the LED board and/or LED tower and/or LED module control gear, to provide fire and shock barrier. As such, material properties to insure the coating is capable of meeting the mechanical (impact), electrical (insulation/transparent dielectric) and fire and/or shock hazard (e.g., UL 8750, UV 94 V0) requirements are met with the presently disclosed compositions and methods herein disclosed. These properties may be provided by the coating itself, or the result of one of more additives present within in the coating.

Thus, the present disclosure provides for a transparent dielectric coating for an LED lighting device, the coating in embodiments provided as a curable composition of one or more precursor components. In other embodiments, a single, curable component composition can be used.

Accordingly, in one embodiment of the present disclosure is provided a precursor component and/or a curable coating for an LED component, element, assembly, and/or lamp. In some aspects, one or more of the precursor components and/or the one-component curable transparent dielectric composition has at least one reactive group suitable for physical or chemical coupling and/or crosslinking for forming a suitable coating for providing transparent dielectric or electrical insulation of one or more electrical components of an LED lighting device, including but not limited to, individual LEDs, energizable electrical components. In additional embodiments, an essentially solvent free transparent dielectric composition is provided with long-term self-life suitable for the manufacturing of large numbers of LED lamps with excellent process latitude, capable of providing an LED lighting device, such as an LED lamp and one or more of its electrical components including LEDs, and LED assemblies, with a transparent dielectric so as to provide electrical, waterproof, shock and/or shatter-proof resistance.

Embodiments of the present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated' listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this present disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output having a color temperature range of from about 2200K to about 6000K.

The terms "crosslink" and "crosslinking" as used herein refer without limitation to joining (e.g., adjacent chains of a polymer) by creating covalent or ionic bonds. Crosslinking can be accomplished by known techniques, for example, thermal reaction, chemical reaction or ionizing radiation (for example, UV/Vis radiation, electron beam radiation, X-ray, or gamma radiation, catalysis, etc.).

The phrase "precursor component" is used herein interchangeably with "coating matrix" and "matrix," and refers without limitation to one or more materials or one or more compositions of matter that are capable of transitioning from a liquid to a solid, semi-solid, or gel suitable for use in or with a light emitting device as a coating of, around, or about one or more components of the lighting device.

A solid-state lighting system, e.g., a LED lighting system or device, may take the form of a lighting unit, light fixture, light bulb, or a "lamp." Embodiments of the present disclosure provide a solid-state lamp with centralized light emitters, more specifically, LEDs (hereinafter, interchangeably used with "LED lamp" or "LED bulb" Multiple LEDs can be used together, forming an LED array. The LEDs can be mounted on or fixed within the lamp in various ways. It should also be noted that the term "lamp" is meant to encompass not only a solid-state replacement for a traditional incandescent bulb as illustrated herein, but also replacements for fluorescent bulbs, replacements for complete fixtures, and any type of light fixture that may be custom designed as a solid state fixture for mounting on walls, in or on ceilings, on posts, and/or on vehicles.

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in the lamp.

Since, ideally, an LED lamp designed as a replacement for a traditional incandescent or fluorescent light source needs to be self-contained; a power supply is included in the lamp structure along with the LEDs or LED packages and the optical components. A heatsink is also often needed to cool the LEDs and/or power supply in order to maintain appropriate operating temperature. The power supply and especially the heatsink can often hinder some of the light coming from the LEDs or limit LED placement. Depending on the type of traditional bulb for which the solid-state lamp is intended as a replacement, this limitation can cause the solid-state lamp to emit light in a pattern that is substantially different than the light pattern produced by the traditional light bulb that it is intended to replace.

An LED lamp may be constructed with a frangible enclosure or "bulb"-like structure that if comprised, in whole or in part, would alter its intended luminescence function or render it completely non-functional. Likewise, the ability of the LED lamp to maintain some level of performance after breach of its enclosure is a desirable attribute that cannot be achieved with an Edison bulb due to the rapid burn out of the tungsten filament, for example. Under such situations, access to the electronic components of the LED lighting device may occur, providing access of natural elements and/or users. Preventing or eliminating electrical communication to the accessing elements improves the adaptability of LED lighting devices for general use. This also provides the LED lamp with the capability for emergency lighting applications, where it is likely the enclosure would be compromised, the luminosity of the LED lamp would nonetheless continue for a desirable time thereafter, with eliminated or reduced risk of electrical communication with objects coming into contact with energized electrical components. For example, the ambient environment can be liquid, the coating preventing the egress of the liquid and/or the gas for a time after breach of the enclosure to provide emergency lighting without creating a short to ground situation. The coating may be configured to allow minutes, hours, days, or weeks of acceptable and/or functional operation under a condition where the energized electrical components are exposed to ambient conditions, for example by breach of the enclosure. The transparent dielectric composition can be selected based on its transparent dielectric and/or electrical insulative properties, as well as its elastic, viscoelastic, impact dampening, diffusion and/or transport properties of gases and liquids and/or its optical transmissive properties.

Of course, the transparent dielectric composition disclosed herein can provide for some level of resistance to breach of the frangible enclosure by virtue of its physical properties and/or transparent dielectric composition thickness, such as its elongation and compressibility properties. These attributes, alone or in combination are provided to the LED lamp with the transparent dielectric composition herein described.

Transparent Dielectric Composition Materials

When the transparent dielectric composition comprises one or more oligomeric or polymeric curable precursors, such curable transparent dielectric composition and/or precursor components herein disclosed provide, among other things, a resultant dielectric, light transparent and optionally a low index of refraction polymeric matrix. Suitable curable transparent dielectric compositions and/or one or more precursor components providing low index of refraction and/or highly visible light transparent organic polymers include silicones, polysiloxanes, polyesters, polyurethanes, acrylics (e.g., polyacrylates, polymethacrylates, hereafter "poly (meth)acrylates"), epoxies, fluoropolymers, and combinations thereof.

Preferably, the resultant light transparent polymeric matrix has an index of refraction of less than about 1.6, preferably less than about 1.5. In one aspect, the light transparent polymeric matrix is transparent in the visible spectra and/or at least a portion of the UV region (e.g., from about 200 nanometers to about 850 nanometers). In other aspects, the light transparent polymeric matrix is transparent in the visible spectra and not transparent (e.g., substantially absorbing) in the UV region (e.g., from about 200 nanometers to about 850 nanometers). Preferably, the light transparent polymeric matrix is at least 85% transparent in the visible spectra, at least 90% transparent, or at least 95% transparent corresponding to the wavelength(s) of the LED light emitted from the package.

In certain aspects, the curable transparent dielectric composition is a one- or two-part-curable formulation comprising one or more precursor components. The precursor component is any one or more precursors that are suitable for and capable of providing an optically transparent transparent dielectric composition for use in a lighting device. In one aspect, the precursor component comprises one precursor. In another aspect, the precursor component is comprised of a "two-part composition". The precursor component provides for a cured or set transparent dielectric composition optionally with other components. The cured or set transparent dielectric composition prepared from the precursor components includes, sol-gels, gels, glasses, ceramics, cross-linked polymers, and combinations thereof.

Examples of cured or set matrixes formed from the one or more precursor components include, for example, one or more polymers and/or oligomers of silicones, e.g., polysiloxanes (e.g., polydialklysiloxanes (e.g., polydimethylsiloxane "PDMS"), polyalkylaryl siloxanes and/or polydiarylsiloxanes), epoxy resins, polyesters, polyarylesters, polyurethanes, cyclic olefinic copolymers (COC's), polynorbornenes, or hybrids and/or copolymers thereof, or such materials in combination with other components. Examples of LED transparent dielectric compositions include, without limitation, LIGHT CAP® LED Casting Resin 9622 acrylated polyurethane, (Dynamax Corp., Torringtion Conn.); LPS-1503, LPS-2511, LPS-3541, LPS-5355, KER-6110, KER-6000, KER-6200, SCR-1016, ASP-1120, ASP-1042, KER-7030, KER-7080 (Shin-Etsu Chemical Co., Ltd, Japan); QSiI 216, QSiI 218, QSiI 222, and QLE 1102 Optically Clear, 2-part Silicone coating (ACC Silicones, The Amber Chemical Company, Ltd.), United Kingdom); LS3-3354 and LS-3351 silicone coatings from NuSil Technology, LLC (Carpinteria, Calif.); TSE- 3032, RTV615, (Momentive Potting Silicone, Waterford, N.Y.); Epic 57253 Polyurethane coating (Epic Resins, Palmyra, Wis.); OE-6630, OE-6631, OE-6636, OE-6336, OE-6450, OE-6652, OE-6540, OE-7630, OE-7640, OE-7620, OE-7660, OE-6370M, OE-6351, OE-6570, JCR-6110, JCR-6175, EG-6301, SLYGUARD silicone elastomers (Dow Corning, Midland, Mich.).

One- or two part-curable precursor component(s) are of low solvent content can be used. More preferably, the one- or two part-curable precursor component(s) are essentially solvent-free. Essentially solvent-free is inclusive of no solvent and trace amounts of low volatility components, where trace amounts is solvent is present, but at an amount less than 5 weight percent, less than 1 weight percent, and less than 0.5 weight percent.

In one aspect, the coating comprises one or more silicon precursor components, which can comprise siloxane and/or polysiloxane. A number of polysiloxanes, with varying backbone structure are suitable for use as a precursor component. With reference to Equation (1), various forms of polysiloxanes, e.g. the M, T, Q, and D backbones, where R is, independently, alkyl or aryl, are presented:

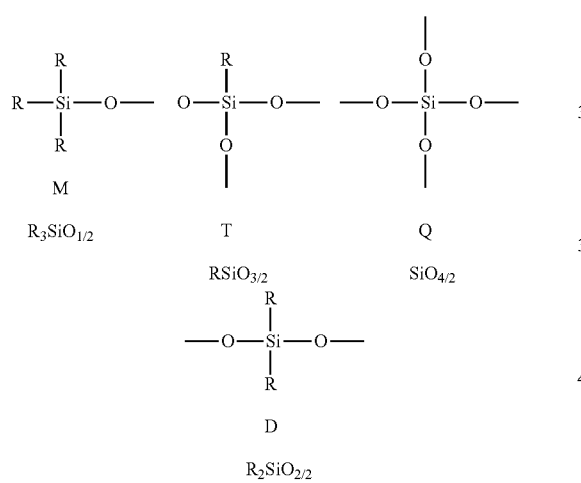

(1)

In various aspects, precursor components comprise one or more reactive silicone containing polymers (and/or oligomers or formulations comprising same). Such one or more reactive functional groups can be mixed with non-reactive silicone containing polymers. Examples of reactive silicone containing polymers with reactive groups, include for example, linear or branched polysiloxanes containing at least one acrylate, methacrylate, acrylamide, methacrylamide, fumarate, maleate, norbornenyl and styrene functional groups, and/or linear or branched polysiloxanes with multiple reactive groups such as Si—H (silicon hydride), hydroxy, alkoxy, amine, chlorine, epoxide, isocyanate, isothiocyanate, nitrile, vinyl, and thiol functional groups. Some specific examples of such linear or branched polysiloxanes include hydride-terminated, vinyl-terminated or methacrylate-terminated polydimethyl siloxanes, polydimethyl-co-diphenyl siloxanes and polydimethyl-co-methylphenylsiloxanes. The reactive groups can be located at one or both terminuses of the reactive silicone polymers, and/or anywhere along the backbone and/or branches of the polymer.

In one aspect, an exemplary example of a silicone precursor component comprises linear siloxane polymers, with dimethyl or a combination of methyl and phenyl chemical groups, with one or more reactive "R" chemical groups; where R is independently, hydrogen, vinyl or hydroxyl. In another aspect, an exemplary example of a silicone precursor component comprises branched siloxane polymers, with dimethyl or a combination of methyl and phenyl chemical groups with one or more reactive "R" chemical groups, where R is independently hydrogen, vinyl or hydroxyl) associated with the precursor component. In another aspect, an exemplary example of a silicone precursor component comprises linear siloxane polymers, with a combination of methyl, phenyl and hydroxyl or alkoxy chemical groups, with one or more reactive "R" chemical groups where R is hydrogen, vinyl or hydroxyl associated with the precursor component. In another aspect, an exemplary example of a silicone precursor component comprises branched siloxanes, with any of methyl, phenyl and hydroxyl or alkoxy chemical groups, with one or more reactive "R" chemical groups where R is hydrogen, vinyl or hydroxyl associated with the precursor component.

In one aspect, one or more of the precursor components can comprise a silsesquioxane and/or polyhedral oligomeric silsesquioxane moiety (hereafter, collectively referred to as "POSS moieties"). POSS moieties suitable for the coating of the present disclosure are represented generally by Formula (1) below:

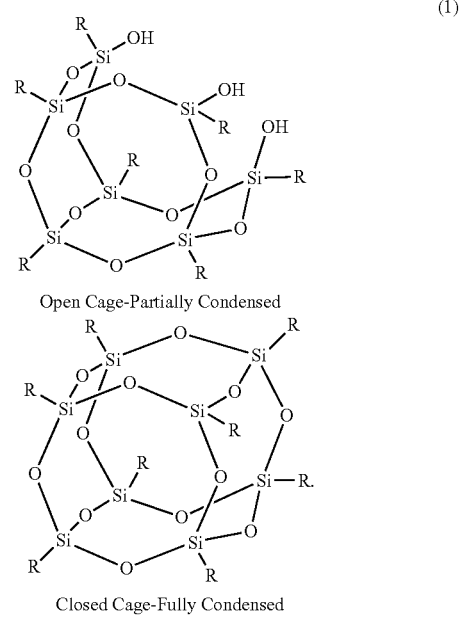

(1)

showing a representative example of an open cage, partially condensed and closed cage, fully condensed POSS moiety, wherein the R groups may be the same or different, optionally with at least one of the R groups being a group having chemical functionality, further described below. In one aspect, at least one of the R groups is associated with and/or provides an precursor component. In other aspects, at least one of the R groups is a reactive group suitable for physical or chemical association or reaction, to provide, or be in combined with, one or more precursor components. The R group may be the same or different, selected from hydrogen, hydroxy, alkoxy, amine, chlorine, epoxide, isocyanate, methacrylate, acrylate, methacrylamide, acrylamide, nitrile, isocyanate, isothiocyanate, norbornenyl, alkenyl, vinyl, styrenyl, or thiol. In the above aspects, at least one of the R groups can optionally be a non-reactive group, which may be the same or different, independently selected from substituted, branched, un-branched, cyclic, or acyclic $C_{1-30}$ alkyl, and aryl and/or substituted, branched, or un-branched $C_{6-30}$ substituted aryl groups.

"POSS moiety", as used herein is inclusive of polyhedral oligomeric silsesquioxanes, and compounds, organic polymers/oligomers, inorganic polymers/oligomers, and/or organic-inorganic polymers containing one or more open and/or closed cage silsesquioxane moieties, with any of the R groups and/or chemical functional groups, described above.

In one example polydimethylsiloxane (PDMS) with hydroxyl (—OH) end-capped groups represents a difunctional, D-type precursor component, that has undergone condensation reactions, forming a linear chain of dimethylsiloxane groups. End-capped hydroxyl groups with either POSS moieties provides for further condensation with any hydrolyzed precursors in which to yield longer linear chains and/or branched structures (incorporating T and Q precursor types) and other chemical functionalities (e.g. methyl, Si—H, vinyl, hydroxyl, etc.). If either the Si—H or Si-vinyl chemical groups are present in or at the terminus of PDMS chains, the polymer or oligomer can be attached to other molecules through hydrosilylation with the respective (Si-vinyl, Si—H) chemical groups, using a platinum catalyst, for example.

Other precursor component structures can be fabricated by including T- and/or O-type precursors with functional groups with a PDMS structure as described above. These precursor types allow for branching of the linear PDMS chain and possess a more inorganic content relative to the M- and D-types. T- and O-type precursor may be used provided excess levels are not used such that the structures with high inorganic content and a highly rigid character result, which may have an adverse effect on mechanical properties (e.g. brittleness, porosity, etc.) and processing (e.g. lower moldability) of the final coating. Thus, in one aspect, a PDMS oligomer precursor with one or more chemical groups are used. For example, a PDMS oligomer having one or more phenyl side groups and Si—H and/or vinyl end-terminated groups is used.

In one aspect, one or more polymers and/or oligomers of polysiloxanes are used. The one or more polymers and/or oligomers of polydialklysiloxanes (e.g., polydimethylsiloxane PDMS), polyalkylaryl siloxanes and/or polydiarylsiloxanes can comprise one or more functional groups selected from acrylate, methacrylate, acrylamide, methacrylamide, fumarate, maleate, norbornenyl and styrene functional groups, and/or polysiloxanes with multiple reactive groups such as hydrogen, hydroxy, alkoxy, amine, chlorine, epoxide, isocyanate, isothiocyanate, nitrile, vinyl and thiol functional groups. Some specific examples of such polysiloxanes include vinyl-terminated-, hydroxyl-terminated, or methacrylate-terminated polydimethyl-co-diphenyl siloxanes and/or polydimethyl-co-methylhydro-siloxanes. In one aspect, the function group is located at one or both terminuses of the precursor component. In one aspect, essentially precursor components comprising or consisting essentially of silsesquioxane moieties and/or polysilsequioxane moieties can be employed for the coating. Polyhedral oligomeric silsesquioxanes and/or polysilsesquioxanes may be either homoleptic systems containing only one type of R group, or heteroleptic systems containing more than one type of R group. POSS-moieties are inclusive of homo- and co-polymers derived from moieties comprising silsesquioxanes with functionality, including mon-functionality and multi-functionality as described above.

In one aspect, one or more POSS moieties having one or more Si—H (silicon hydride) groups can be used and/or added to precursor components, e.g. silicones having Si-vinyl functional groups) to provide a coating via a platinum metal catalyzed hydrosilation reaction between the POSS hydride functionality and precursor component Si-vinyl functional groups. The Si—H and Si-vinyl functional groups can be reversed, that is, Si-vinyl groups can be associated with the POSS moiety and Si—H functional groups can be associated with the precursor components. Likewise, combinations of POSS moieties comprising, independently, Si—H and Si-vinyl functional groups can be used as the precursor components.

Additional substances in the aforementioned coating or one or more precursor components providing the coating can be used, e.g., platinum catalyst, casting aids, defoamers, surface tension modifiers, functionalizing agents, adhesion promoters, crosslinking agents, viscosity stabilizers, other polymeric substances, and substances capable of modifying the tensile, elongation, optical, thermal, rheological, and/or morphological attributes of the precursor component or resulting coating.

In one aspect, a curable precursor component alone or with other material can be used specifically for forming coating for a LED lamp, for example, a LED lamp with a glass or ceramic enclosure surrounding the LEDs and/or electrical components, the coating deposited on energizable electrical components, one or more LEDs, LED arrays, as well as functioning as a sealant for the glass or ceramic enclosure about a suitable base, for example an Edison base.

Additives

In one aspect, one or more viscosity stabilizers are used in combination with the one or more precursor components, for example, to extend the useful life of the coating prior to its application to the led lamp or its electrical components. In one aspect, the viscosity stabilizer provides for a slow increase in viscosity of a curable one- or two-part-composition prepared in the course of coating an led lamp. In one particular aspect, the viscosity stabilizer is specific for a platinum metal and/or rhodium noble metal catalyzed hydrosilation reaction between a Si-hydride and Si-vinyl functional groups. In one aspect, viscosity stabilizer can include phosphines, phosphites, phosphinites, phosphonites, phosphinates, phosphonates, phosphates, arsines, stibenes, selenide, telluride chlorinated hydrocarbons that contain amines, hydroperoxy radical containing compounds, acetylenic compounds, maleates, dicarboxylates, and/or copper salts of naphthenic acid, alkynic or alkynl alcohols, allyl or other unsaturated compounds can also be used as viscosity stabilizers, ethyl acetate, vinyl acetate, monomers or polymers containing acetate, fumaric acid, vinyl siloxanes, divinyl siloxanes, tetramethyl divinyl disiloxane, pentamethyl vinyl disiloxane, compounds containing nitrides, amines or amides, nitriles, cyanates, oximo, nitroso, hydrazo, azo compounds, compounds containing tin, fatty acid tin salts, such as those used in tin-catalyzed silicone release coatings; as well as general compounds, pigments, fillers, additives; minerals that contain compounds listed previously; pigments that contain compounds listed previously; fillers such as silica, titanium oxide, aluminum oxide, alumina, titania, calcium carbonate containing compounds listed previously; sodium salts, such as sodium alginate or carboxymethylcellulose sodium salt, clays or binders that use polyvinylacetate or acrylics, anti-slip, antioxidant or other additives containing compounds listed previously, polyvinylacetate; polyvinylacetate/acrylic; and the like.

The present compositions, if containing Si—H/Si-vinyl groups or Si—OH groups, can be catalyzed by a platinum and/or rhodium catalyst components, which can be all of the known platinum or rhodium catalysts which are effective for catalyzing the reaction between silicon-bonded hydrogen groups and silicon-bonded olefinic groups.

Diffusers/Phosphors/Spectral Notch Filters

In certain aspects, the curable coating and/or one or more precursor components can further comprise one or more of a diffusing material and/or phosphors and/or spectral notch filter compounds (e.g. rare-earth element compounds). Thus, in any one or more of the aforementioned precursor component embodiments or resultant coating, a phosphor and/or diffuser and/or notch filter can be added, incorporated therein, associated therewith, and/or combined. Phosphors include, for example, commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white-light emitting LED chips include, for example: $Tb_{3-x}RE_xO_{12}$:Ce(TAG), where RE is Y, Gd, La, Lu; or $Sr_{2-x-y}Ba_xCa_ySiO_4$:Eu.

Some phosphors appropriate for these structures can comprise, for example: Red $Lu_2O_3$:Eu$^{3+}$($Sr_{2-x}La_x$)($Ce_{1-x}Eu_x$)$O_4Sr_2Ce_{1-x}Eu_xO_4Sr_{2-x}Eu_xCeO_4SrTiO_3$:Pr$^{3+}$,Ga$^{3+}$ $CaAlSiN_3$:Eu$^{2+}Sr_2Si_5N_8$:Eu$^{2+}$ as well as $Sr_xCa_{1-x}S$:EuY, where Y is halide; $CaSiAlN_3$:Eu; and/or $Sr_{2-y}Ca_ySiO_4$:Eu. Other phosphors can be used to create color emission by converting substantially all light to a particular color. For example, the following phosphors can be used to generate green light: $SrGa_2S_4$:Eu; $Sr_{2-y}Ba_ySiO_4$:Eu; or $SrSi_2O_2N_2$:Eu.

By way of example, each of the following phosphors exhibits excitation in the UV emission spectrum, provides a desirable peak emission, has efficient light conversion, and has acceptable Stokes shift, for example: Yellow/Green: (Sr, Ca,Ba)(Al,Ga)$_2S_4$:Eu$^{2+}Ba_2$(Mg,Zn)$Si_2O_7$:Eu$^{2+}$ $Gd_{0.46}Sr_{0.31}Al_{1.23}O_xF_{1.38}$:Eu$^{2+}$0.06($Ba_{1-x-y}Sr_xCa_y$)$SiO_4$:Eu $Ba_2SiO_4$:Eu$^{2+}$.

The lighting device can comprise solid-state light sources arranged with one or more phosphors so as to provide at least one of blue-shifted yellow (BSY), blue-shifted green (BSG), blue-shifted red (BSR), green-shifted red (GSR), and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Likewise, a cyan LED with a red emitting phosphor radiationally coupled thereto and absorbing some of the cyan light and emitting red light provides for a device having CSR light.

Diffusers include light reflecting particles, for example, from material of high index of refraction. The high index of refraction material can be any material with an index of refraction of greater than about 2, greater than about 2.2, and greater than or equal to about 2.4, such as titanium dioxide, aluminum oxide, zinc oxide, zinc sulfide and combinations thereof. The average particle size of the diffuser particles can be between about 1 nanometer (nanoparticles) to about 500 microns. The diffuser can be added alone or in combination with the phosphor to the curable coating or to either part (Part A and/or Part B) or both parts of a two-part curable coating.

Spectral notch compounds, e.g., rare-earth metal compounds, include compounds of neodymium, didymium, dysprosium, erbium, holmium, praseodymium and thulium, such as their oxides, halogens, nitrates, acetates, hydroxides, phosphates, sulfates, and hydrates thereof, for example, neodymium(III) nitrate hexahydrate $(Nd(NO_3)_3.6H_2O)$; neodymium(III) acetate hydrate $(Nd(CH_3CO_2)_3.xH_2O)$; neodymium(III) hydroxide hydrate $(Nd(OH)_3)$; neodymium (III) phosphate hydrate $(NdPO_4.xH_2O)$; neodymium(III) carbonate hydrate $(Nd_2(CO_3)_3.xH_2O)$; neodymium(III) isopropoxide $(Nd(OCH(CH_3)_2)_3)$; neodymium(III) titanante $(Nd_2O_3.xTiO_2)$; neodymium(III) chloride hexahydrate $(NdCl_3.6H_2O)$; neodymium(III) fluoride $(NdF_3)$; neodymium(III) sulfate hydrate $(Nd_2(SO_4)_3.xH_2O)$; neodymium(III) oxide $(Nd_2O_3)$; erbium(III) nitrate pentahydrate $(Er(NO_3)_3.5H_2O)$; erbiu (III) oxalate hydrate $(Er_2(C_2O_4)_3.xH_2O)$; erbium(III) acetate hydrate $(Er(CH_3CO_2)_3.xH_2O)$; erbium(III) phosphate hydrate $(ErPO_4.xH_2O)$; erbium(III) oxide $(Er_2O_3)$; Samarium(III) nitrate hexahydrate $(Sm(NO_3)_3.6H_2O)$; Samarium(III) acetate hydrate $(Sm(CH_3CO_2)_3.xH_2O)$; Samarium(III) phosphate hydrate $(SmPO_4.xH_2O)$; Samarium(III) hydroxide hydrate $(Sm(OH)_3.xH_2O)$; samarium(III) oxide $(Sm_2O_3)$; holmium(III) nitrate pentahydrate $(Ho(NO_3)_3.5H_2O)$; holmium(III) acetate hydrate $((CH_3CO_2)_3Ho.xH_2O)$; holmium(III) phosphate $(HoPO_4)$; and holmium(III) oxide $(Ho_2O_3)$. Other rare earth metal compounds, including organometallic compounds of neodymium, didymium, dysprosium, erbium, holmium, praseodymium and thulium can be used.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially while light can be found in issued U.S. Pat. No. 7,213,940, which is incorporated herein by reference.

Led Lamp Examples

LED lamps of any variety and/or shape can be used in the practice of the present disclosure. In one example, LED lamps with longitudinally extending projections having arranged or placed thereon, one or more LEDs are employed in the methods herein disclosed.

By way of example, LED lamps are disclosed as exemplary lighting devices suitable for the present disclosure. The lamp may also comprise a directional lamp such as BR-style lamp or a PAR-style lamp where the LEDs may be arranged on a longitudinally extending projection to provide directional light, with or without reflecting surfaces. In other embodiments, the LED lamp can have any shape, including standard and non-standard shapes.

Thus, with reference to FIGS. 1A, 1B, 2A, 2B, 3A, 3B, 3C, 3D, lamp 100, 300, 400 having globe shaped main body 114, comprises a solid-state lamp comprising a LED assembly 130 with light emitting LEDs 127. Multiple LEDs 127 can be used together, forming an LED array 128. The LEDs 127 can be mounted on or fixed within the lamp in various ways. The LEDs 127 of LED array 128 are mounted on a submount 129 and are operable to emit light when energized through an electrical connection. In the present disclosure the term "submount" is used to refer to the support structure that supports the individual LEDs or LED packages and in one embodiment comprises a PCB although it may comprise other structures such as a lead frame extrusion, MCPCB, or the like or combinations of such structures. The LEDs 127 in the LED array 128 include LEDs which may comprise an LED die disposed in an encapsulant such as silicone, and LEDs which may be encapsulated with a phosphor to provide local wavelength conversion when various options for creating white light are discussed. A wide variety of LEDs and combinations of LEDs may be used in the LED assembly 130. FIG. 1B is a partial exploded view of lamp 100 having a transparent dielectric composition disposed as coating 69 on outer surface of the LED array 128. Coating 69 can be on inside surface and/or both inside/outside surfaces of the LED array 128 as described herein.

In some embodiments, the LED bulb 100 is equivalent to a 60 Watt incandescent light bulb. In one embodiment of a 60 Watt equivalent LED bulb, the LED assembly 130 comprises an LED array 128 of 20 XLamp® XT-E High Voltage white LEDs manufactured by Cree, Inc., where each XLamp® XT-E LED has a 46 V forward voltage and includes 16 DA LED chips manufactured by Cree, Inc. and configured in series. The XLamp® XT-E LEDs may be configured having LEDs arranged in series, for a total of greater than 200 volts, e.g. about 230 volts, across the LED array 128. In another embodiment of a 60 Watt equivalent LED bulb, 20 XLamp® XT-E LEDs are used where each XT-E has a 12 V forward voltage and includes DA LED chips arranged in series, for a total of about 240 volts across the LED array 128 in this embodiment. In some embodiments, the LED bulb 100 is equivalent to a 40 Watt incandescent light bulb. In such embodiments, the LED array 128 may comprise 10 XLamp® XT-E LEDs where each XT-E includes 16 DA LED chips configured in series. The 10 46V XLamp® XT-E® LEDs may be configured in two parallel strings where each string has five LEDs arranged in series, for a total of about 230 volts across the LED array 128. In other embodiments, different types of LEDs are possible, such as XLamp® XB-D LEDs manufactured by Cree, Inc. or others. Other arrangements of chip on board LEDs and LED packages may be used to provide LED based light equivalent to 40, 60 and/or greater other watt incandescent light bulbs, at about the same or different voltages across the LED array 128. In other embodiments, the LED assembly 130 can have different shapes, such as triangular, square and/or other polygonal shapes with or without curved surfaces.

Still referring to FIGS. 1A, 1B, a modified base 102 is shown comprising a two part base having an upper part 102a that is coupleable to enclosure 112 and a lower part 102b that is joined to the upper part 102a. An Edison screw 103 is formed on the lower part 102b for connecting to an Edison socket. The base 1102 may be connected to the enclosure 112 by any suitable mechanism including adhesive, welding, mechanical connection or the like, and may be connected and/or sealed using the transparent dielectric composition as disclosed herein. The lower part 102b is joined to the upper part 102a by any suitable mechanism including adhesive, welding, mechanical connection or the like. The base 102 may be made reflective to reflect light generated by the LED lamp. The base 102 may be provided with a larger diameter at an intermediate portion thereof, the internal volume of the base expanded over that provided by a cylindrical base for receiving and retaining a power supply/drivers 110 in the base. The LED assembly 130 may be mounted to a heat sink structure 149 by an electrical interconnect 150 where the electrical interconnect 150 provides the electrical connection between the LED assembly 130 and the lamp electronics, e.g., power supply/drivers 110.

The exemplary LED lamp 100 merely illustrates an embodiment that, among other things, can serve as a replacement for an incandescent bulb. Lamp 100 may be used as an A-series lamp with an Edison base 102, more particularly; lamp 100 is designed to serve as a solid-state replacement for an A19 incandescent bulb. The Edison base 102 as shown and described herein may be implemented through the use of an Edison connector 103 and a plastic form. The LEDs 127 in the LED array 128 may comprise an LED die coated (and/or encapsulated) in the presently disclosed transparent dielectric composition, and optionally with LEDs which are encapsulated with a phosphor to provide local wavelength conversion when various options for creating white light are desired. In one aspect, the coated and/or encapsulated LEDs 127 maintain sufficient heat transfer heat sink 149 relative to an LED lamp without the presently disclosed transparent dielectric composition. The LEDs 127 of LED array 128 are mounted on a submount 129 and are operable to emit light when energized through an electrical connection. Extensions 190, as shown, may be formed on the LED assembly ("LED tower") that connect the LED assembly 130 to a heat dissipating portion 154 and that positions and supports the LEDs 127 in the proper position in the enclosure, for example. In some embodiments, a driver or power supply may be included with the LED array on the submount. In some cases the driver may be formed by components on a printed circuit board or "PCB" 80. While a lamp having the size and form factor of a standard-sized household incandescent bulb is shown, the lamp may have other the sizes and form factors. For example the lamp may be a PAR-style lamp such as a replacement for a PAR-38 incandescent bulb. Any and all of the "exposed" energizable electrical components, including LED tower and/or LED module control gear and/or portions of the LED board of the above LED lamp 100 can be contacted with, coated, and/or encapsulated by the present transparent dielectric coating disclosed herein. Various attachment members can be used to connect the base, power supply, heat dissipation elements and/or provide electrical or heat conduction throughout LED lamp 102, such as features 101, 109, and 107 of base 102 cooperatively coupling and/or connect with features 111, 168, 170, 172, 174, and 192 of heat sink 149 and/or LED assembly 130, for example, so as to provide lamp with PCB 80 and electrical interconnect 150 securely contained within the lamp, among other advantages.

Enclosure 112 is, in some embodiments, made of a frangible material, such as glass, quartz, borosilicate, silicate, or ceramic or other suitable material. The enclosure may be of similar shape to that commonly used in household incandescent bulbs. In some embodiments, the glass enclosure is coated on the inside with silica or other diffusive material such as refractory oxides, providing a diffuse scattering layer that produces a more uniform far field pattern. The enclosure may also be etched, frosted and coated with the protective layer as disclosed herein. Alternatively, the surface treatment may be omitted and a clear enclosure may be provided. It should also be noted that in this or any of the embodiments shown here, the optically transmissive enclosure or a portion of the optically transmissive enclosure could be coated or impregnated with phosphor or a diffuser. The glass enclosure 112 may have a traditional bulb shape having a globe shaped main body 114 that tapers to a narrower neck 115.

A lamp base 102 such as an Edison base functions as the electrical connector to connect the lamp 100 to an electrical socket or other connector. Depending on the embodiment, other base configurations are possible to make the electrical connection such as other standard bases or non-traditional bases. Base 102 may include the electronics 110 for powering lamp 100 and may include a power supply and/or driver and form all or a portion of the electrical path between the mains and the LEDs. Base 102 may also include only part of the power supply circuitry while some smaller components reside on the submount. With the embodiment of FIGS. 1A and 1B, as with many other embodiments of the present disclosure, the term "electrical path" can be used to refer to the entire electrical path to the LED array 128, including an intervening power supply disposed between the electrical connection that would otherwise provide power directly to the LEDs and the LED array, or it may be used to refer to the connection between the mains and all the electronics in the lamp, including the power supply. The term may also be used to refer to the connection between the power supply and the LED array. Electrical conductors run between the LED assembly 130, which seats against the heat conducting portion 152 to ensure good thermal conductivity between these elements, and the lamp base 102 to carry both sides of the supply to provide critical current to the LEDs 127. One or more portions of the "electrical path" can be contacted with, encapsulated by, or coated with the transparent dielectric composition disclosed herein.

The LED assembly 130 may be implemented using a printed circuit board ("PCB") and may be referred by in some cases as an LED PCB. In some embodiments the LED PCB comprises the submount 129. The lamp 100 comprises a solid-state lamp comprising a LED assembly 130 with light emitting LEDs 127. Multiple LEDs 127 can be used together, forming an LED array 128. The LEDs 127 can be mounted on or fixed within the lamp in various ways. In at least some example embodiments, a submount 129 is used. The LEDs 127 in the LED array 128 include LEDs which may comprise an LED die disposed in an encapsulant such as silicone, which is separate and apart from the presently disclosed transparent dielectric composition, and the LEDs may be encapsulated with a phosphor to provide local wavelength conversion. A wide variety of LEDs and combinations of LEDs may be used in the LED assembly 130 as described herein. The LEDs 127 of the LED array 128 are operable to emit light when energized through an electrical connection. An electrical path runs between the submount 129 and the lamp base 102 to carry both sides of the supply to provide critical current to the LEDs 127.

Still referring to FIGS. 1A-2B, in some embodiments, a driver and/or a power supply are included with the LED array 128 on the submount 129. In other embodiments the driver and/or power supply are included in the base 102 as shown. The power supply and drivers may also be mounted separately where components of the power supply are mounted in the base 102 and the driver is mounted with the submount 129 in the enclosure 112. Base 102 may include a power supply or driver and form all or a portion of the electrical path between the mains and the LEDs 127. The base 102 may also include only part of the power supply circuitry while some smaller components reside on the submount 129. In some embodiments any component that goes directly across the AC input line may be in the base 102 and other components that assist in converting the AC to useful DC may be in the glass enclosure 112. In one example embodiment, the inductors and capacitor that form part of the EMI filter are in the Edison base.

In some embodiments a gas movement device may be provided within the enclosure 112 to increase the heat transfer between the LEDs 127 and LED assembly 130 and heat sink 149. The movement of the gas over the LED assembly 130 moves the gas boundary layer on the components of the LED assembly 130. In some embodiments the gas movement device comprises a small fan. The fan may be connected to the power source that powers the LEDs 127. While the gas movement device may comprise an electric fan, the gas movement device may comprise a wide variety of apparatuses and techniques to move air inside the enclosure such as a rotary fan, a piezoelectric fan, corona or ion wind generator, synjet diaphragm pumps or the like.

The LED assembly 130 comprises a submount 129 arranged such that the LED array 128 is substantially in the center of the enclosure 112 such that the LED's 127 are positioned at the approximate center of enclosure 112. As used herein the term "center of the enclosure" refers to the vertical position of the LEDs in the enclosure as being aligned with the approximate largest diameter area of the globe shaped main body 114. In one embodiment, the LED array 128 is arranged in the approximate location that the filament is disposed in a standard incandescent bulb. The present disclosure provides a transparent dielectric for one or more of the above configurations, and one or more of the LED board and/or LED tower and/or LED module control gear arrangements.

FIGS. 2A and 2B show sectional views of LED lamp 100 without enclosure. In certain aspects of the embodiments, the transparent dielectric composition is introduced to the LED assembly 130 as further described below. Transparent dielectric composition can be dispensed or deposited on upper surface 154a of heat dissipating portion 154 to electrically insulate base 102, PCB 80, and/or lamp electronics-side contact 164b. In other aspects, transparent dielectric composition can be used to seal an enclosure to upper surface 154a.

FIG. 3A, FIG. 3B, and FIG. 3C are embodiments of another exemplary LED lamp, more specifically, lamps different from an omnidirectional lamp such as an A19 replacement bulb discussed above. With reference to FIG. 3A, the LED assembly 130 may be directed toward an exit surface of the lamp. An LED 127 positioned as described herein may have a beam angle of approximately 120° such that at least some of the light emitted from the LEDs 127 is directed directly out the exit surface. In order to capture this light and shape the beam, a reverse or downward facing reflector 1200 may be added as shown in FIG. 3A. The reflector 1200 captures light that is projected toward the exit surface of the lamp and reflects that light from reflecting surface 1200a to a primary reflector such that the light may be projected in the desired beam angle by the primary reflector (not shown). With reference to FIG. 3B and FIG. 3C, a perspective view of a directional lamps, such as a replacement for a parabolic aluminized reflector ("PAR") incandescent bulb, is shown. Thus, the bulbs) shown in FIGS. 3B-3C may be used as a solid state replacements for BR-type and PAR-type reflector type bulbs or other similar bulbs. Any suitable reflector 308 may be used as the reverse reflector to redirect the light toward the primary reflectorin the BR or PAR bulbs shown in FIG. 3B and FIG. 3C, the light is emitted in a directional pattern rather than in an omnidirectional pattern. Standard BR or PAR type bulbs are reflector bulbs that reflect light in a directional pattern; however, the beam angle is not tightly controlled and may be up to about 90-100 degrees or other fairly wide angles. Thus, numerous bulbs can be used in accordance with the methods described herein such as A19, A21, PAR20, PAR30, PAR38, BR30, BR40, R20, etc. type bulbs. Additional examples of LED lamps include those described in co-assigned U.S. application Ser. No. 13/774,078, as filed on Feb. 22, 2013, U.S. application Ser. No. 13/467,670, as filed on May 9, 2012, and U.S. application Ser. No. 13/446,759, as filed on Apr. 13, 2012, all of which are incorporated by reference herein in their entirety.

Methods

To further explain the coating 69 and/or dielectric properties imparted to the exemplary lamp 100 and 200, embodiment of methods of coating a lamp will be described. Any coating method useful for materials of similar viscosity to that of the precursor components (mixed or separately) can be used. For example, each part of a two-part composition can be separately handled, for example, in a spray apparatus, or they can be combined prior to or subsequent to being sprayed, atomized, or rolled on the surface of the LED lamp. In other example, the LED lamp can be dip coated into a bath of one or more of the precursor components. The precursor components can be mixed together or can be configured in separate baths for sequential dipping of the LED lamp. In another aspect, the LED lamp can be cascade-coated by passing through one or more flowing streams of one or more precursor components.

In another aspect, a combination of coating processes can be used, for example, a dip or cascade coating in combination with a spray coating. In one aspect, a second spray coating process can provide for one or more "coats" deposited on a first coating that was previously deposited so as to provide a defined thicker coating about the portions of the LED lamp, for example, that would provide the likely short to ground events and/or ground fault interruption events, such sections having thicker coating 69 improve dielectric performance of coating 69, as well as improving impact resistance for the specific portion or region of the LED device.

In certain aspects, the viscosity of the one or more precursor components is provided within a target range for the mode of application. For example, for dip coating, the one or more precursor components can be solvent-free. Thus, in one aspect, the viscosity of the one or more precursor components is chosen to be between about 500 to about 10,000 centipoise, or about 750 to about 8000 centipoise, or about 1000 to about 8000 centipoise, or about 1500 to about 7000 centipoise, or about 2000 to about 6500 centipoise. In one aspect, the viscosity of the one or more precursor components is chosen to be between about 3000 to about 6000 centipoise, for example, to allow a continuous dip coating process of any of the LED components.

However, the viscosity of such solvent-free silicone elastomer mixtures increases from an initial viscosity, rapidly increasing at room temperature and becoming too viscous to be useable after a short time (3-24 hrs), making large-scale production processes difficult, in-efficient, and costly. Thus, in an embodiment, one or more viscosity stabilizers can be used in combination with the one or more precursor components to maintain a target viscosity for a time interval at a temperature above that of a set/cure/gel temperature (a temperature capable of setting, curing, or gelling of the precursor components in the absence of the viscosity controlling agent). Maintaining a viscosity within a range is useful to control the coating thickness and/or coating weight about the LED lamp. The viscosity controlling agent can be used so that the temperature of the one or more precursor components can be maintained at an elevated temperature, e.g., any temperature below the set/cure temperature to alter the viscosity and thus provide for control of the thickness and/or weight of coating applied.

After the transparent dielectric composition and/or precursor components are deposited on the one or more LED components, the transparent dielectric composition can be cured, or the cure process can be accelerated, by using heat and/or light to initiate and/or accelerate the crosslinking or coupling of the precursor components or to overcome the viscosity stabilizer FIG. 4A is an exemplary coating process in accordance with embodiments of the present disclosure. Thus, LED lamp 100 (shown partially assembled) can be inverted and presented to dip tank 500 containing curable transparent dielectric composition 505, which may be precursor materials or oligomeric or polymeric materials as disclosed above. As shown in step 502 LED lamp 100 is inserted into curable transparent dielectric composition 505 for a time and at a temperature sufficient to provide contact of the composition to the LED lamp 100 components. Step 504 illustrates the removal of the coated LED lamp 100a. The removal rate in combination with the viscosity and/or concentration of the dielectric composition 505 can be adjusted to provide a desired film thickness. Coated LED lamp 100a can be subjected to subsequent heating and/or UV exposure to cure and/or cross-link the transparent dielectric composition 505. The resultant coating of at least a portion of the energizable electronic components is shown in expanded view 4B of FIG. 4B, showing LEDs 127 having deposited thereon cured transparent dielectric coating 69. FIG. 5 depicts a subsequent enclosure assembly step for LED lamp 100a, where in certain aspects curable transparent dielectric composition 505 can be used as a sealant and/or adhesive to secure enclosure 112 to upper surface 154a of heat dissipating portion 154. Other securement and/or arrangements of enclosure 112 and LED lamp 100a can be used.

FIG. 6A is an exemplary coating process of LED array submount 129 in accordance with embodiments of the present disclosure. In this embodiment spray device 601 applies curable transparent dielectric composition 505 to LED array submount 129. This process can be adjusted such that the LEDs 127 are coated whereas contact 188 is not, for example by limiting spray pattern to region 151 or masking region 153. Even if energizable components or heat dissipating elements are coated, so long as the electrical contact and thermal contact were established prior thereto, the effect of the transparent dielectric coating on electrical and heat dissipation is not significant.

FIG. 6B is an exemplary coating process of a partially assembled LED lamp 200 in accordance with embodiments of the present disclosure. As shown, spraying at 601 dispenses curable transparent dielectric composition 505 to LED lamp 200 which can be rotated about its longitudinal axis B. In addition to energizable electrical components such as LED assembly 130 and LED array 128, reflector 1200 and/or its reflective surface 1200a can be coated.

Application of a clear or visible light transparent silicone elastomer as an example of a dielectric coating 69 on a LED tower was performed. The resultant LED lamp was capable of meeting internal mechanical (impact), electrical (insulation/transparent dielectric) and fire and shock hazard testing requirements similar to UL testing. In addition, the present method provides for a solvent-free coating process that is suitable for dip coating LED components, and the resultant coated LED components can be enclosed in a standard glass enclosure that is clear, and tack free.

Any aspect or features of any of the embodiments described herein can be used with any feature or aspect of any other embodiments described herein or integrated together or implemented separately in single or multiple components.

The presently disclosed precursor components and resulting coating prepared therefrom provide a number of solutions to the aforementioned problems. In one aspect, the resultant light transparent polymeric matrix, when present on a surface of an enclosure of an LED lamp, is capable of preventing or eliminating access to the internal components of the LED lamp should the enclosure be subjected to force that would otherwise shatter, chip, or break open the enclosure.

Thus, the presently disclosed transparent dielectric composition precursor components and resulting coating prepared therefrom uses less material, i.e., silicone, and therefore provides significant cost savings for large-scale manufacturing. It also provides a less complicated manufacturing process. Additional benefits include LED lamps and devices with no "rubbery texture" on the exterior of the enclosure leading to improved consumer acceptance.

In addition, as one or more types of the transparent dielectric composition can function as adhesives and/or sealants, less stringent requirements for the glue used to attach the enclosure to the heat sink and/or base of the LED device is provided.

Although specific embodiments have been illustrated and described herein, those of ordinary skill in the art appreciate that any arrangement, which is calculated to achieve the same purpose, may be substituted for the specific embodiments shown and that the present disclosure has other applications in other environments. This application is intended to cover any adaptations or variations of the present disclosure. The following claims are in no way intended to limit the scope of the present disclosure to the specific embodiments described herein.

We claim:

1. A method of maintaining the mechanical and electrical integrity of a light emitting diode (LED) lamp, the method comprising:
   providing an LED lamp with at least one LED and associated exposed energizable electrical components contained within an optically transmissive, frangible enclosure;
   applying a liquid visible light transparent dielectric coating directly on at least a portion of the exposed energizable components, wherein the visible light transparent dielectric coating extends onto a surface of the optically transmissive enclosure;
   curing the visible light transparent dielectric coating deposited on the exposed energizable components; and
   maintaining the mechanical and electrical integrity of the LED lamp upon breach of the frangible enclosure.

2. The method of claim 1, wherein the visible light transparent dielectric coating comprises one or more curable oligomeric or polymeric siloxanes, acrylates, or urethanes.

3. The method of claim 1, further comprising curing the one or more curable oligomeric or polymeric siloxanes, acrylates, or urethanes.

4. The method of claim 1, wherein the visible light transparent dielectric is directly deposited on all of the energizable electrical components.

5. The method of claim 1, wherein the LED lamp further comprises one or more of a reflector, a diffuser, or a lens, and wherein the visible light transparent dielectric coating is deposited on the reflector, the diffuser, or the lens.

6. The method of claim 5, further providing a heat sink thermally coupled to the LED assembly for transmitting heat from the LED assembly to the ambient environment, wherein the visible light transparent dielectric coating does not substantially alter heat transfer between the LED assembly and the heat sink.

7. The method of claim 1, wherein the visible light transparent dielectric coating dampens external vibrational energy, external shear energy, or external impact energy introduced to the LED lamp.

8. The method of claim 1, wherein the visible light transparent dielectric coating prevents fire upon breach of the frangible enclosure and provides shock protection upon breach of the frangible enclosure.

9. The method of claim 1, wherein the visible light transparent dielectric coating prevents short circuit events or ground-fault interrupt events after breach of the optically transmissive enclosure.

10. The method of claim 1, wherein the optically transmissive enclosure is glass or ceramic.

11. An LED assembly comprising:
    an LED lamp with at least one LED and associated exposed energizable electrical components contained within an optically transmissive, frangible enclosure; a visible light transparent dielectric coating directly on at least a portion of the exposed energizable components, wherein the visible light transparent dielectric coating extends onto a surface of the optically transmissive enclosure; wherein the visible light transparent dielectric coating is deposited on the exposed energizable components; and wherein the mechanical and electrical integrity of the LED lamp is maintained upon breach of the frangible enclosure.

12. The LED assembly of claim 11, wherein the visible light transparent dielectric coating comprises one or more polysiloxanes, polyacrylates, or polyurethanes.

13. The LED assembly of claim 11, wherein the visible light transparent dielectric coating is transparent to light between about 250 nm to about 850 nm.

14. The LED assembly of claim 11, wherein the visible light transparent dielectric coating is at least partially non-transparent to light between about 250 nm to about 850 nm.

15. The LED assembly of claim 11, further comprising a heat sink thermally coupled to the LED assembly for transmitting heat from the LED assembly to the ambient environment.

16. The LED assembly of claim 15, further comprising a base coupled to heat sink.

17. The LED assembly of claim 16, further comprising an electrical interconnect for mechanically connecting a conductor to the heat sink, wherein the conductor is in the electrical path between the LED assembly and the base.

18. The LED assembly of claim 16, further comprising an optically transmissive enclosure.

19. The LED assembly of claim 11, further comprising one or more of a reflector, a diffuser, or a lens, and wherein the visible light transparent dielectric coating is deposited on the reflector, the diffuser, or the lens.

20. A method of coating an LED lamp comprising:
providing an LED lamp comprising:
 a base;
 an LED assembly coupled to the base, the LED assembly having at least one LED operable to emit light when energized through an electrical path;
contacting at least a portion of the LED assembly and at least a portion of the electrical path thereof with a curable visible light transparent dielectric coating;
attaching an optically transmissive enclosure, and
curing the visible light transparent dielectric coating, the visible light transparent dielectric coating sealing the optically transmissive enclosure to the base.

21. The method of claim 20, wherein the visible light transparent dielectric coating comprises one or more curable oligomeric or polymeric siloxanes, acrylates, or urethanes.

22. The method of claim 21, further comprising curing the one or more curable oligomeric or polymeric siloxanes, acrylates, or urethanes, the cured oligomeric or polymeric siloxanes, acrylates, or urethanes being optically transparent between about 250 nm to about 850 nm.

23. The method of claim 21, wherein the one or more curable oligomeric or polymeric siloxanes is substantially organic solvent-free.

24. The method of claim 20, wherein the visible light transparent dielectric coating comprises one or more curable oligomeric or polymeric siloxanes having alkenyl-containing functional groups and/or silicon hydride functional groups.

25. The method of claim 20, wherein the LED lamp further comprises a submount on which the LED assembly is coupled, wherein the submount comprises at least one of a PCB, metal core board, lead frame and metal core printed circuit board, the visible light transparent dielectric coating sealing the subassembly to the base.

26. The method of claim 20, wherein the LED lamp further comprises a heat sink thermally coupled to the LED assembly for transmitting heat from the LED assembly to the ambient environment, the visible light transparent dielectric coating does not substantially alter heat transfer between the LED assembly and the heat sink.

27. The method of claim 20, wherein the LED lamp further comprises one or more of a reflector, a diffuser, or a lens, and wherein the visible light transparent dielectric coating is a deposited on the reflector, the diffuser, or the lens.

28. The method of claim 20, wherein the contacting is one or more of dipping, spraying, or brushing.

* * * * *